US011177309B2

(12) United States Patent
Cheng et al.

(10) Patent No.: US 11,177,309 B2
(45) Date of Patent: Nov. 16, 2021

(54) IMAGE SENSOR WITH PAD STRUCTURE

(71) Applicant: Taiwan Semiconductor Manufacturing Co., Ltd., Hsinchu (TW)

(72) Inventors: Yun-Wei Cheng, Taipei (TW); Chun-Hao Chou, Tainan (TW); Kuo-Cheng Lee, Tainan (TW); Hsun-Ying Huang, Tainan (TW); Yin-Chieh Huang, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 9 days.

(21) Appl. No.: 16/741,405

(22) Filed: Jan. 13, 2020

(65) Prior Publication Data

US 2020/0152687 A1    May 14, 2020

Related U.S. Application Data

(62) Division of application No. 15/907,654, filed on Feb. 28, 2018, now Pat. No. 10,535,698.

(60) Provisional application No. 62/591,507, filed on Nov. 28, 2017.

(51) Int. Cl.
*H01L 27/146*        (2006.01)

(52) U.S. Cl.
CPC .... *H01L 27/14636* (2013.01); *H01L 27/1463* (2013.01); *H01L 27/1464* (2013.01); *H01L 27/14683* (2013.01); *H01L 27/14689* (2013.01)

(58) Field of Classification Search
None
See application file for complete search history.

(56) References Cited

U.S. PATENT DOCUMENTS

| 6,133,136 | A | 10/2000 | Edelstein et al. |
| 8,247,306 | B2 | 8/2012 | Nakazawa et al. |
| 8,502,335 | B2 | 8/2013 | Tseng et al. |
| 9,136,298 | B2 | 9/2015 | Lin et al. |
| 10,403,670 | B2 | 9/2019 | Umebayashi et al. |
| 10,734,429 | B2 | 8/2020 | Cheng et al. |
| 2009/0289345 | A1* | 11/2009 | Tsai ................. H01L 21/76898 257/690 |
| 2010/0181637 | A1* | 7/2010 | Harada ................. H01L 23/481 257/459 |
| 2012/0086092 | A1* | 4/2012 | Yanagita ............. H01L 27/1464 257/432 |
| 2014/0246707 | A1* | 9/2014 | Koo .................. H01L 27/14689 257/230 |

(Continued)

FOREIGN PATENT DOCUMENTS

| CN | 1350703 A | 5/2002 |
| CN | 1464529 A | 12/2003 |

(Continued)

*Primary Examiner* — Erik Kielin
(74) *Attorney, Agent, or Firm* — Sterne, Kessler, Goldstein & Fox P.L.L.C.

(57) ABSTRACT

The present disclosure relates to an image sensor with a pad structure formed during a front-end-of-line process. The pad structure can be formed prior to formation of back side deep trench isolation structures and metal grid structures. An opening is formed on a back side of the image sensor device to expose the embedded pad structure and to form electrical connections.

20 Claims, 9 Drawing Sheets

(56) References Cited

U.S. PATENT DOCUMENTS

| | | | | |
|---|---|---|---|---|
| 2015/0115386 A1* | 4/2015 | Chuang | ............... | H01L 27/1469 257/443 |
| 2015/0145082 A1* | 5/2015 | Lee | ................... | H01L 31/0352 257/432 |
| 2015/0287758 A1* | 10/2015 | Ando | ................ | H01L 27/14627 257/774 |
| 2018/0301491 A1* | 10/2018 | Nakamoto | ........ | H01L 27/14645 |
| 2019/0148427 A1* | 5/2019 | Lee | ................... | H01L 27/1463 257/446 |

FOREIGN PATENT DOCUMENTS

| | | |
|---|---|---|
| CN | 101840925 A | 9/2010 |
| CN | 107293529 A | 10/2017 |
| JP | 2005191492 A | 7/2005 |
| KR | 20100102533 A | 9/2010 |
| KR | 20110013222 A | 2/2011 |
| KR | 20150026992 A | 3/2015 |

\* cited by examiner

IMAGE SENSOR WITH PAD STRUCTURE

CROSS-REFERENCE TO RELATED APPLICATION

This application is a divisional of U.S. Non-provisional patent application Ser. No. 15/907,654, titled "Image Sensor with Pad Structure," filed on Feb. 28, 2018, which claims the benefit of U.S. Provisional Patent Application No. 62/591,507, titled "Image Sensor with Pad Structure." which was filed on Nov. 28, 2017 and are both incorporated herein by reference in their entireties.

BACKGROUND

Semiconductor image sensors are used to sense radiation such as light. Complementary metal-oxide-semiconductor (CMOS) image sensors (CIS) and charge-coupled device (CCD) sensors are used in various applications, such as digital still camera and mobile phone camera applications. These devices utilize an array of pixels (which may include photodiodes, photo detectors, and/or transistors) in a substrate to absorb (e.g., sense) radiation that is projected toward the pixels and convert the sensed radiation into electrical signals. An example of an image sensor is a back side illuminated (BSI) image sensor device, which detects light from a back side of a substrate.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Figure 1:
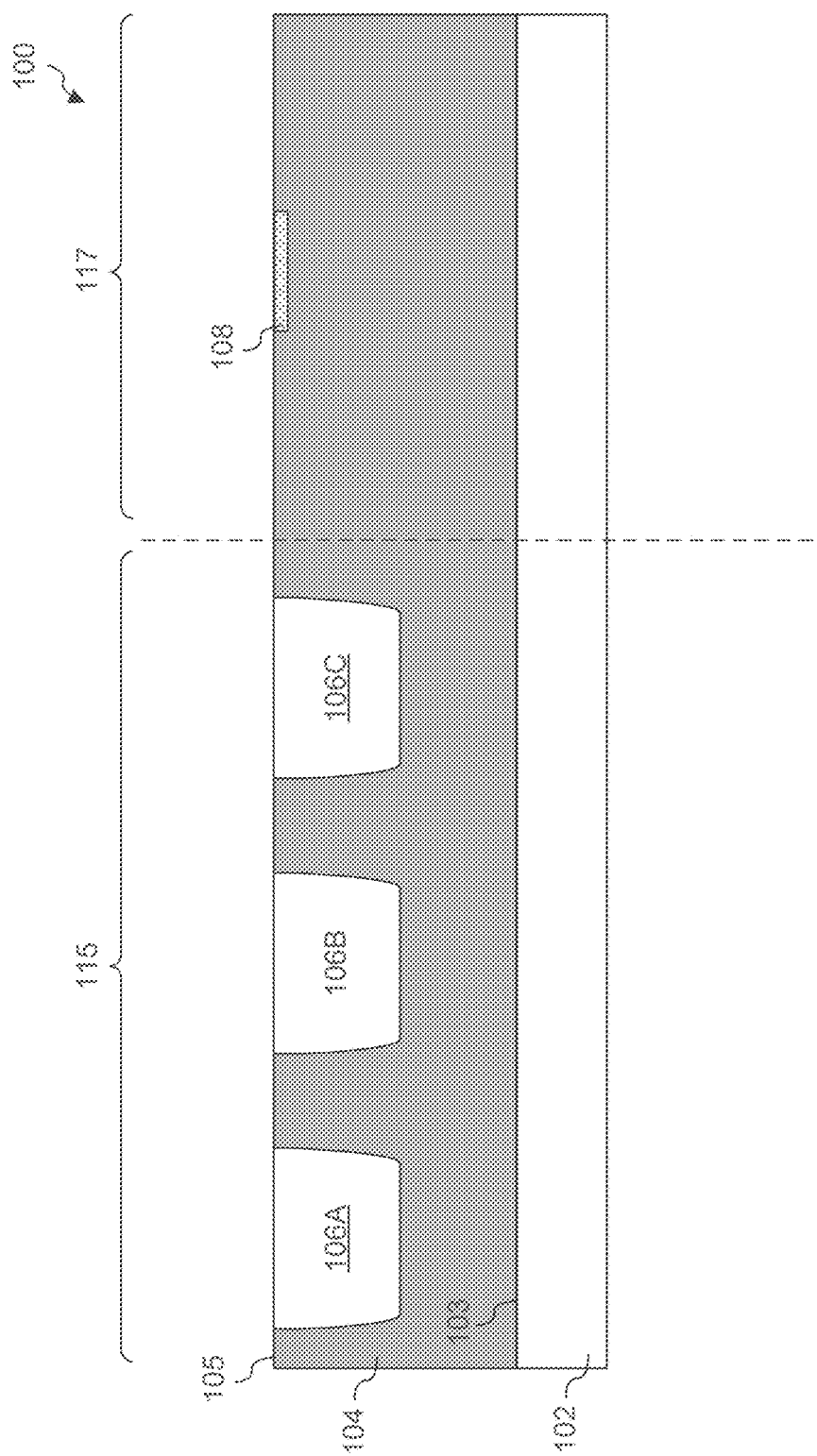
FIGS. 1-4 are cross-sectional views of an exemplary image sensor device with a pad structure formed during a back side fabrication process, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes or tolerances.

The term "substantially" as used herein indicates the value of a given quantity varies by ±5% of the value.

The term "about" as used herein indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

A back side illuminated (BSI) image sensor device has a silicon substrate or semiconductor material layer in which light-sensing pixels or photodetectors are formed. BSI image sensors include an array of photodetectors arranged within a semiconductor substrate that overlies an interconnect structure. The photodetectors extend into the semiconductor substrate and are configured to receive radiation from an upper side of the semiconductor substrate. Back side deep trench isolation (BDTI) structures are arranged on the upper side of the semiconductor structure and extend into the semiconductor substrate. The BDTI structures are arranged laterally between the light-sensing photo detectors to define respective grid patterns providing optical isolation between neighboring photodetectors. A metal grid structure or a composite metal grid (CMG) structure is formed on the back side of the BSI image sensor device.

A color filtering material is filled between adjacent CMG structures to form color filters. The color filtering material can be selected such that light with a desired wavelength passes through the filtering material, while light with other wavelengths are absorbed by the color filtering material. For example, a green light filtering material receiving unfiltered natural light would allow the green light portion (wavelength between about 495 nm and about 570 nm) through the filter while absorbing the rest of the light. The color filters are aligned to respective photodetectors for providing filtered light to the corresponding photodetectors.

A buried color filter array (BCFA) is an arrangement of color filtering material in a grid structure. The BFCA can reduce an optical path of the BSI image sensor device. In a BFCA process of the BSI image sensor fabrication, across-wafer device uniformity and planarization uniformity are important quality factors that can be challenging to achieve. During the BFCA process, openings with embedded devices formed on the back surface of the BSI image sensor devices can be filled with a dielectric material prior to planarization.

However, planarization of the dielectric material and adjacent structures may be difficult and lead to defects in the device.

Examples of openings and embedded structures can be pad structures that are arranged in peripheral openings of the semiconductor structure and laterally adjacent to the photodetectors. Interconnect structures are arranged under the semiconductor substrate, and the pad structure protrudes through a lower surface of the peripheral opening to be electrically coupled to the interconnect structures. The pad structures are used for electrically connecting the image sensor device to external circuitry for sending and receiving signals such as data or control signals. Pad structures can be electrically connected to the external circuitry through wire bonding or other electrical interconnection methods. Peripheral openings and embedded pad structures are formed after the photodetectors and before the planarization process. A dielectric filler layer is deposited to fill the peripheral opening prior to the planarization process. However, planarization of the dielectric filler layer and adjacent structures may be difficult and may lead to device defects, especially for BSI image sensor devices that are proximate to a wafer's edge.

Various embodiments in accordance with this disclosure describes forming a pad structure in an image sensor device (e.g., BSI image sensor device) during a front-end-of-line (FEOL) process. Peripheral openings are formed in the photodetector substrate and conductive material is deposited into the peripheral openings. The photodetector substrate is bonded with a carrier wafer and other device structures (such as BDTI structures) and CMG structures are subsequently formed. An opening is formed on the back side of the BSI image sensor device to expose the embedded pad structure and to form electrical connections. Forming the pad structure during the FEOL process provides, among other things, benefits of (i) reducing a total number of masks needed for pad formation; (ii) eliminating a need for a dielectric fill process prior to planarization; and (iii) providing a uniform planarized wafer surface prior to the CMG formation which in turn leads to across-wafer uniformity.

Before describing the embodiments related to forming pad structures during an FEOL process (described below with respect to FIGS. 5-9), an exemplary image sensor device with a pad structure formed during a back side fabrication process is discussed in FIGS. 1-4.

FIG. 1 is a cross-sectional view of a partially-fabricated image sensor device 100 after photo detectors are formed in a semiconductor layer, in accordance with some embodiments of the present disclosure. Image sensor device 100 is a semiconductor image sensor device. Partially-fabricated image sensor device 100 includes a substrate 102 and a semiconductor layer 104. Partially-fabricated image sensor device 100 also includes a pixel region 115 where photo detectors 106A-106C are formed and a pad region 117 where a shallow trench isolation (STI) structure 108 is formed.

Substrate 102 can be a p-type substrate such as, for example, a silicon material doped with a p-type dopant such as boron. In some embodiments, substrate 102 can be an n-type substrate such as, for example, a silicon material doped with an n-type dopant such as phosphorous or arsenic. In some embodiments, substrate 102 can include, germanium, diamond, a compound semiconductor, an alloy semiconductor, a silicon-on-insulator (SOI) structure, any other suitable material, and/or combinations thereof. Substrate 102 can have an initial thickness that is in a range from about 100 μm to about 3000 μm.

Semiconductor layer 104 is formed on substrate 102 and includes a semiconductor material such as, for example, silicon, germanium, a compound semiconductor, an alloy semiconductor, any other suitable semiconductor material, and/or combinations thereof. In some embodiments, semiconductor layer 104 can be an epitaxial material strained for performance enhancement. Semiconductor layer 104 includes a back surface 103 and a front surface 105. In some embodiments, semiconductor layer 104 has a thickness greater than 2 μm. In some embodiments, semiconductor layer 104 has a thickness greater than 5 μm.

Radiation-sensing regions—for example, photo detectors 106A-106C—are formed in a portion of semiconductor layer 104 designated as pixel region 115. Photo detectors 106A-106C are configured to sense radiation (or radiation waves) such as incident light waves. Photo detectors 106A-106C each include a photodiode structure. In some embodiments, photo detectors 106A-106C can each include a pinned layer photodiode, a photogate, a reset transistor, a source follower transistor, a transfer transistor, any other suitable structure, and/or combinations thereof. Photo detectors 106A-106C can also be referred to as "radiation-detection devices" or "light-sensors". For simplicity purposes, three photo detectors 106A-106C are illustrated in FIG. 1; however any number of photo detectors may be implemented in semiconductor layer 104. In some embodiments, photo detectors 106A-106C are formed by performing an implantation process on semiconductor layer 104 from front surface 105. The implantation process can include doping semiconductor layer 104 with a p-type dopant such as boron in some embodiments, the implantation process can include doping semiconductor layer 104 with an n-type dopant such as phosphorous or arsenic. In some embodiments, photo detectors 106A-106C can also be formed by a diffusion process.

STI structure 108 is formed in a portion of semiconductor layer 104 designated as pad region 117. Pad region 117 is a peripheral region adjacent to photo detectors 106A-106C and used for a subsequent pad structure formation. A trench is formed in semiconductor layer 104 by a patterning and etching process, and STI structure 108 is deposited to fill the trench. STI structure 108 can be used as an isolation structure or as an etch stop layer for the subsequent pad structure formation STI structure 108 can be made of a dielectric material such as, for example, silicon oxide, spin-on-glass, silicon nitride, silicon oxynitride, fluorine-doped silicate glass (FSG), a low-k dielectric material, other suitable insulating material, and/or combinations thereof. STI structure 108 can be formed by a blanket deposition process of STI material followed by a chemical-mechanical polishing (CMP) and etch-back process. Other fabrication techniques for STI structure 108 are possible.

Figure 2:
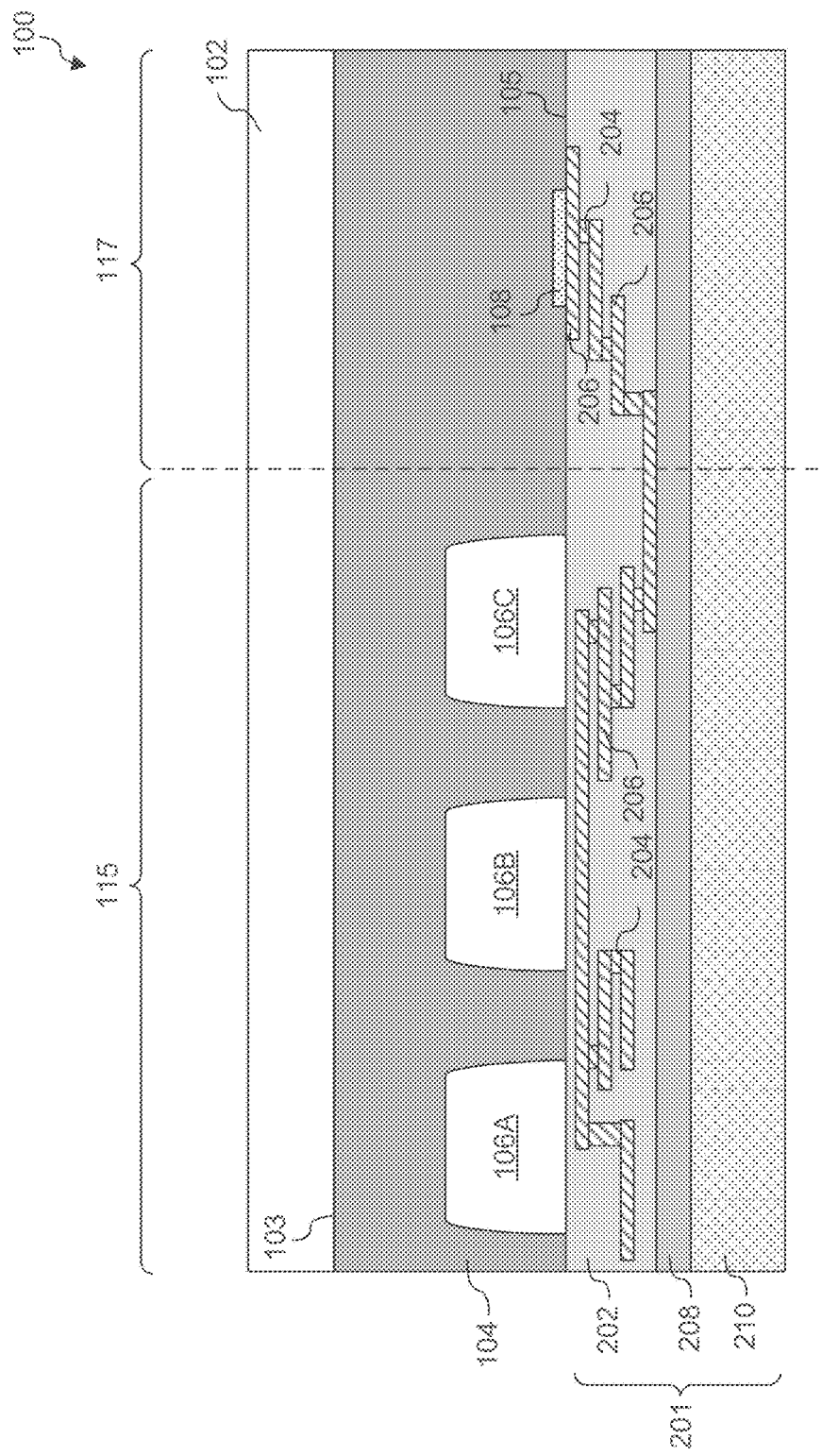

FIG. 2 is a cross-sectional view of a partially-fabricated image sensor device 100 after an interconnect structure is formed, in accordance with some embodiments of the present disclosure. The partially-fabricated image sensor device in FIG. 1 is flipped over and semiconductor layer 104 is bonded to a carrier wafer 201 at front surface 105 in some embodiments, carrier wafer 201 is bonded to semiconductor layer 104 by a suitable bonding method such as, for example, fusion bonding, hybrid bonding, anodic bonding, direct bonding, any other suitable bonding process, and/or combinations thereof. Carrier wafer 201 can include an interlayer dielectric 202, conductive vias 204, conductive lines 206, a buffer layer 208, and a carrier substrate 210.

Interlayer dielectric 202 is disposed on (e.g., beneath) front surface 105 of the semiconductor layer 104. Conductive layers and structures that provide interconnections (e.g., wiring) between various doped features, circuitry and input/output of the image sensor device 100 are embedded in interlayer dielectric 202. The conductive layers and structures can be part of a multilayer interconnect (MLI) structure that includes contacts, vias, and/or metal lines. As shown in FIG. 2, conductive vias 204 and conductive lines 206 are embedded in interlayer dielectric 202. Conductive vias 204 and conductive lines 206 are provided as examples; other conductive structures can be included, in which the positioning and configuration of the MLI structure can vary depending on design needs. Conductive vias 204 and conductive lines 206 can be formed of conductive materials such as, for example, copper, aluminum, tungsten, doped polysilicon, other suitable conductive material, and/or combinations thereof. The MLI structure can be electrically coupled to photo detectors 106A-106C. Other circuits and devices used to sense and process received light can also be embedded in interlayer dielectric 202 and are not illustrated in FIG. 2 for simplicity. The MLI structure includes a conductive layer that is aligned with and in contact with STI structure 108 after the bonding process.

Buffer layer 208 can be formed using a dielectric material such as, for example, silicon oxide, silicon nitride, other suitable dielectric material, and/or combinations thereof. Buffer layer 208 can be formed by a suitable deposition method such as, for example, chemical vapor deposition (CVD), plasma-enhanced CVD (PECVD), atomic layer deposition (ALD), physical vapor deposition (PVD), any other suitable process, and/or combinations thereof. Buffer layer 208 can be planarized to form a smooth surface by a planarization process (e.g., a chemical mechanical polishing process). In some embodiments, buffer layer 208 provides electrical isolation between substrate 102 and carrier substrate 210.

Carrier substrate 210 provides mechanical support to the partially-fabricated image sensor device so that processes on back surface 103 can be performed. In some embodiments, carrier substrate 210 can be formed using a material similar to substrate 102. For example, carrier substrate 210 includes a silicon material. In some embodiments, carrier substrate 210 includes a glass substrate. In some embodiments, interlayer dielectric 202 is formed on semiconductor layer 104, and carrier substrate 210 is bonded onto interlayer dielectric 202 through buffer layer 208.

Figure 3:
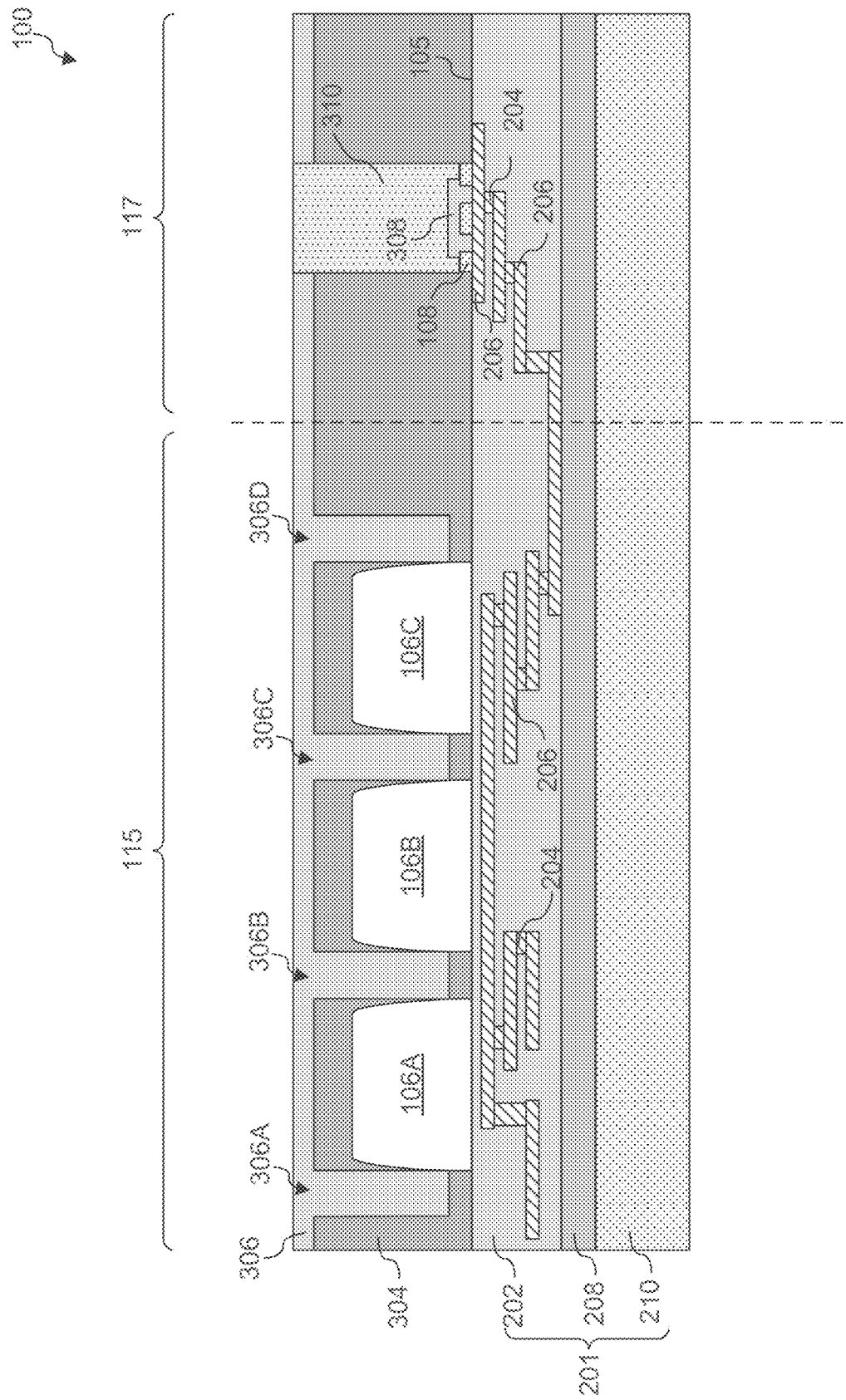

FIG. 3 is a cross-sectional view of a partially-fabricated image sensor device 100 after BDTI structures and contact pads have been formed in a semiconductor layer, in accordance with some embodiments of the present disclosure. Partially-fabricated image sensor device 100 includes a patterned semiconductor layer 304, BDTI structures 306A-306D, a pad structure 308, and a dielectric fill 310.

Substrate 102 is removed and semiconductor layer 104 can be thinned prior to forming trenches between photo detectors. Any suitable method to remove substrate 102 can be used such as, for example, a planarization process (e.g., chemical mechanical polishing), a wet etching method, a dry etching method, any other suitable method, and/or combinations thereof. Patterned semiconductor layer 304 is formed after semiconductor layer 104 has been thinned and patterned. In some embodiments, trenches are formed in semiconductor layer 104 without semiconductor layer 104 being thinned in some embodiments, trenches can be high aspect ratio trenches such as, for example, trenches having aspect ratio greater than 6. The etching process to form the trenches can be a timed etching process, which the etching process continues until nominal depths of the trenches are achieved.

Isolation material 306 is deposited over the exposed surface of patterned semiconductor layer 304 by a blanket deposition followed by a planarization process. Isolation material 306 fills the trenches and forms BDTI structures 306A-306D. Each BDTI structure is formed between photo detectors; for example, BDTI structure 306B is formed between photo detectors 106A and 106B. Isolation material 306 can be formed using any suitable dielectric material such as, for example, silicon oxide, silicon nitride, any other suitable dielectric material, and/or combinations thereof. In some embodiments, a liner layer (not shown) is formed between isolation material 306 and patterned semiconductor layer 304. The liner layer can be formed using a high-k dielectric material such as, for example, hafnium oxide ($HfO_2$), tantalum pentoxide ($Ta_2O_5$), zirconium dioxide ($ZrO_2$), aluminum oxide ($Al_2O_3$), other high-k material, and/or combinations thereof. Isolation material 306 can be deposited using any suitable deposition method such as, for example, atomic layer deposition (ALD), molecular beam epitaxy (MBE), high density plasma CVD (HDPCVD), metal organic (MOCVD), remote plasma CVD (RPCVD), plasma-enhanced CVD (PECVD), plating, other suitable methods, and/or combinations thereof. After isolation material is deposited, a planarization process such as, for example, a chemical mechanical polishing process is performed on the deposited isolation material 306 to form a planar top surface. In some embodiments, BDTI structures 306A-306D can prevent crosstalk between photo detectors (e.g., between adjacent photo detectors 106A and 106B and between adjacent photo detectors 106B and 106C).

After isolation material 306 is deposited and BDTI structures 301A-306D are formed, a pad structure 308 is formed in pad region 117 and electrically connected to the MLI structures formed in interlayer dielectric 202. Pad structure 308 is formed by opening a peripheral opening in patterned semiconductor layer 304, exposing STI structure 108, forming openings in STI structure 108, depositing and etching a conductive material.

Figure 4:
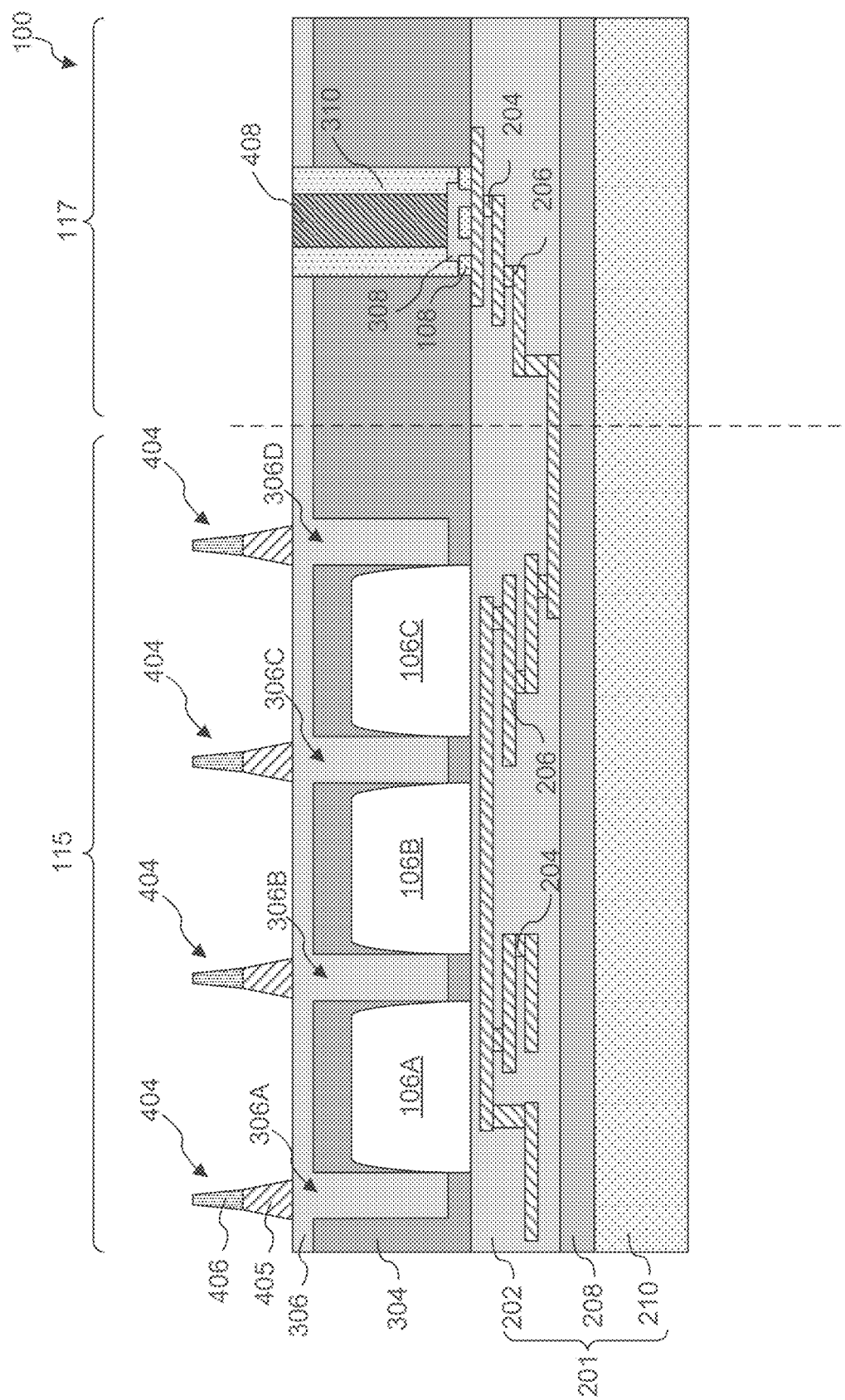

FIG. 4 is a cross-sectional view of a partially-fabricated image sensor device 100 after CMG structures and plug structures are formed on a top surface of a patterned semiconductor layer, in accordance with some embodiments of the present disclosure. As shown in FIG. 4, pad structure 308 includes base portions that are formed above a top surface of STI structure 108 and also includes protruding portions that protrudes through a bottom surface of STI structure 108 to electrically connect to a conductive line 206 of the MLI structure. Pad structure 308 can be formed using a conductive material such as, for example, copper, aluminum, tungsten, silver, any other suitable conductive material, and/or combinations thereof.

Dielectric fill 310 is formed to cover pad structure 308 and to subsequently fill the peripheral openings. Dielectric fill 310 is used to protect pad structure 308 during subsequent processing steps and can be deposited by a blanket deposition followed by a planarization process such that the top surface of dielectric till 310 is coplanar with a top surface of patterned semiconductor layer 304. The planarization process and patterned semiconductor layer 304 can be challenging because of different material selectivity of the planarization process A "dishing effect" can occur that results in a concave top surface of dielectric fill 310. The concave top surface may lead to defects in the BSI image sensor devices, especially for BSI image sensor devices that are approximate to the wafer edge during fabrication processes.

Metal grid structures, such as CMG structures 404, are formed over the BDTI structures 306A-306D and on isolation material 306. Each metal grid structure of CMG structure 404 is formed between photo detectors—e.g., between photo detectors 106A and 106B and between photo detectors 106B and 106C. In some embodiments, CMG structures 404 include a first portion 405 and a second portion 406. First portion 405 can be formed using a metal material such as, for example, titanium, tungsten, aluminum, copper, or any other suitable material having a reflectance property capable of reflecting light. In some embodiments, second portion 406 includes a dielectric material such as, for example, silicon oxide, spin-on-glass, silicon nitride, silicon oxynitride, fluorine-doped silicate glass (FSG), a low-k dielectric material, other suitable insulating material, and/or combinations thereof. CMG structures 404 are not limited to the above structures and materials and can have more than two portions and include more than two types of materials. For example, additional portions can be formed on second portion 406 to achieve a nominal height for the CMG structures. CMG structures 404 can include a material with a relatively high reflectance property so that the material can reflect light along a path substantially towards a corresponding photodiode as opposed to the material absorbing the light or allowing the light to pass through the material. In some embodiments, CMG structure 404 is formed using any suitable process such as, for example, a sputtering process, a plating process, an evaporation process, other deposition and/or etching processes, and/or combinations thereof. For example, the metal grid can be formed by initially depositing metal material and then selectively etching away portions of the metal material.

Plugs 408 are formed in dielectric fill 310 to be electrically coupled to pad structure 308. Plugs 408 can use any suitable conductive material such as copper, aluminum, niobium, tungsten, other suitable conductive material, and/or combinations thereof. An patterning process is performed to form an opening in dielectric fill 310, and the plug material is deposited using a blanket deposition followed by a planarization process such that top surfaces of the deposited plug material in the openings are coplanar with a top surface of patterned semiconductor layer 304.

In the processes described above in FIGS. 1-4, pad structure 308 is formed after BDTI structures 306A-306D are formed and before the formations of CMG structures 404. This formation sequence requires forming peripheral openings after BDTI structures 306A-306D are formed and uses dielectric fill 310 to fill the peripheral openings during the planarization process. As described above, the planarization process performed on the dielectric fill and patterned semiconductor layer 304 can be challenging to control and could induce device defects that in turn lead to device quality degradation. In some embodiments, these challenges can be addressed by forming the pad structure during an FEOL process.

FIGS. 5-8 illustrate fabrication processes of a partially-fabricated BSI image sensor device with a pad structure formed during an FEOL process. In FIGS. 5-8, peripheral openings and embedded pad structures are formed in the photodetector substrate prior to the wafer bonding process and also prior to the formation of the BDTI and CMG structures. The BSI image sensor device with an FEOL formed pad structure eliminates the need of using dielectric fill material to fill the peripheral openings prior to planarization because the pad structures are pre-formed in the peripheral openings and are covered by the silicon substrate. The silicon substrate provides a planar wafer surface without concaves for the subsequent CMG formation.

Figure 5:
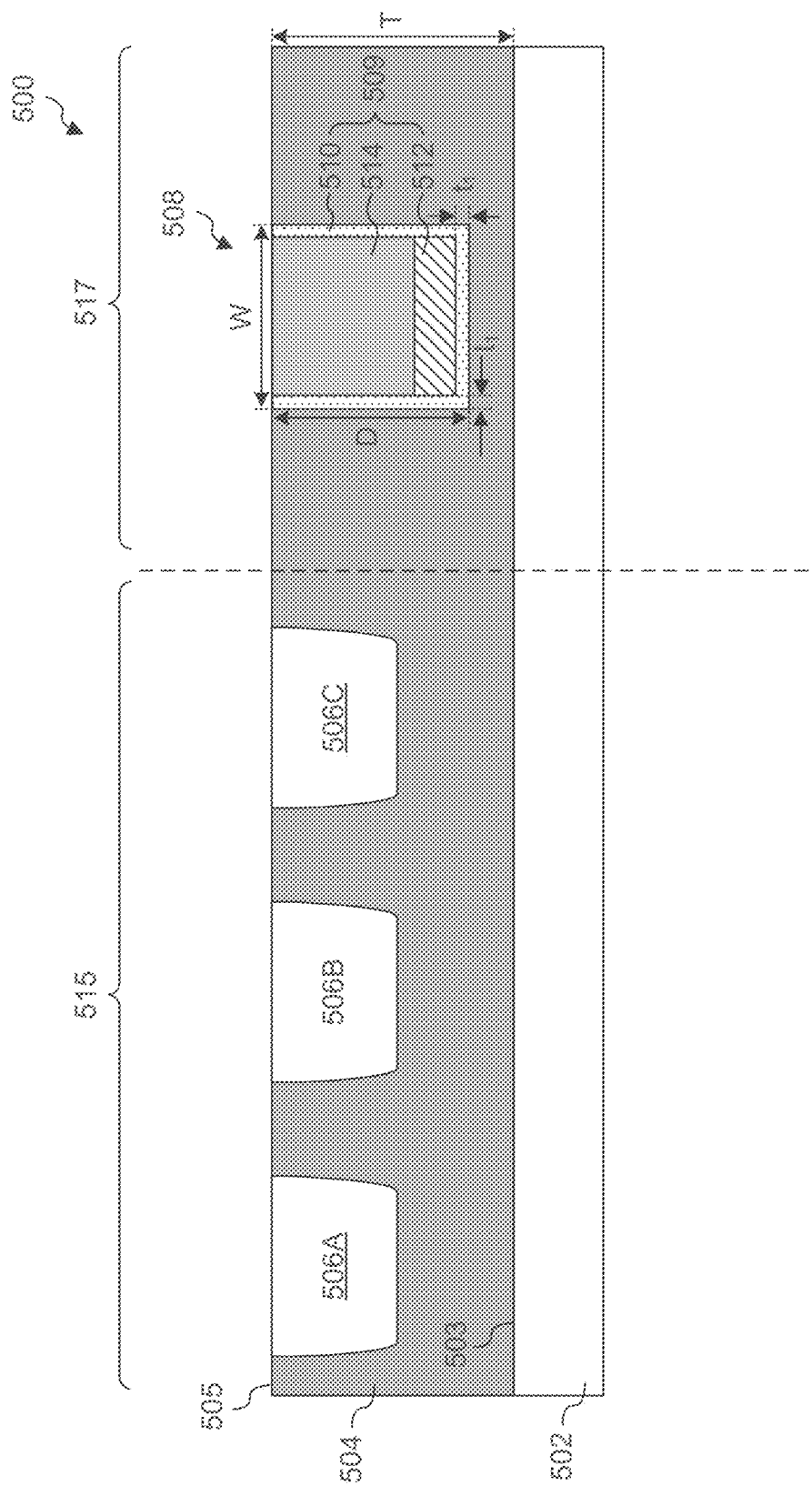
FIGS. 5-8 are cross-sectional views of an exemplary image sensor device with a pad structure formed during front-end-of-line (FEOL) process, in accordance with some embodiments.

FIG. 5 is a cross-sectional view of a partially-fabricated BSI image sensor device 500 after photo detectors and pad structures are formed in a semiconductor layer, in accordance with some embodiments of the present disclosure. BSI image sensor device 500 is a semiconductor image sensor device. Partially-fabricated BSI image sensor device 500 is a photodetector substrate that includes a substrate 502 and a semiconductor layer 504. Partially-fabricated BSI image sensor device 500 also includes a pixel region 515 where photo detectors 506A-506C are formed and a pad region 517 including a peripheral opening 508, a pad structure 509. Pad structure 509 includes a liner layer 510, a capping layer 512, and a metal till 514.

Substrate 502 can be similar to substrate 102 as described above in FIG. 1. For example, substrate 502 can be a p-type substrate or an n-type substrate. In some embodiments, substrate 502 can include other suitable materials or structures. Substrate 502 can have an initial thickness that is in a range from about 100 μm to about 3000 μm.

Semiconductor layer 504 can be similar to semiconductor layer 104 as described above in FIG. 1. For example, semiconductor layer 504 can include any suitable semiconductor material or compound semiconductor materials. In some embodiments, semiconductor layer 504 can be an epitaxial material. Semiconductor layer 504 includes a back surface 503 and a front surface 505. In some embodiments, semiconductor layer 504 has a thickness T greater than 2 μm as shown in FIG. 5. In some embodiments, semiconductor layer 504 has a thickness T greater than 5 μm.

Photo detectors 506A-506C are formed in a portion of semiconductor layer 504 designated as pixel region 515. Photo detectors 506A-506C can be similar to photo detectors 106A-106C described above in FIG. 1 and are configured to sense radiation such as incident light waves. Photo detectors 506A-506C each includes a photodiode structure and can include any other suitable structures. For simplicity purposes, three photo detectors 506A-506C are illustrated in FIG. 5; however any number of photo detectors may be implemented in semiconductor layer 504. In some embodiments, photo detectors 506A-506C are formed using methods similar to the methods used to form photo detectors 106A-106C, as described above in FIG. 1. For example, an implantation process using p-type or n-type dopants can be performed on front surface 505. In some embodiments, photo detectors 506A-506C can also be formed by a diffusion process.

Pad structure 509 is formed in a portion of semiconductor layer 504 designated as pad region 517. Pad region 517 is a peripheral region adjacent to photo detectors 506A-506C and used for pad structure formation. As the photodetector substrate will be bonded with a carrier substrate, peripheral opening 508 is formed in semiconductor layer 104 and placed at a location that is aligned with an interconnect structure of the carrier substrate, which is described in further detail below with reference to FIG. 6. Peripheral opening 508 can be fabricated using suitable processes, including patterning and etch processes. The patterning process can include forming a photoresist layer overlying semiconductor layer 504, exposing the resist to a pattern, performing post-exposure bake processes, and developing the resist to form a masking element including the resist. The masking element can protect regions of semiconductor layer 504 while an etch process forms peripheral opening 508 in semiconductor layer 504. The exposed semiconductor layer 504 not covered by the resist can be etched using a reactive ion etch (RIE) and/or other suitable process. Other methods to form peripheral opening 508 in semiconductor layer 504 may be suitable. For example, a deep RIE process can be used, in accordance with some embodiments. The etching process continues until a nominal depth of peripheral opening 508 has been reached. Peripheral opening 508 can have a width W that is between about 10 µm and about 150 µm. The depth D of peripheral opening 508 can be in a range of about 80% to about 95% (e.g., 80% to 95%) of thickness T of semiconductor layer 504. The depth D can be determined by a number of factors. For example, a greater depth D can provide easier access to peripheral opening 508 through back surface 503 in subsequent fabrication steps due to a reduced depth of material that needs to be removed between peripheral opening 508 and back surface 503.

Pad structure 509 is formed in peripheral opening 508 and includes a liner layer 510, a capping layer 512, and a metal fill 514. Pad structure 509 has the same width of peripheral opening 508, according to some embodiments. Liner layer 510 can protect the exposed surface of semiconductor layer 504 during subsequent fabrication processes. In some embodiments, liner layer 510 can be a barrier layer to prevent electro-migration and/or metal diffusion into semiconductor layer 504. Liner layer 510 can be made of a dielectric material such as, for example, silicon oxide, silicon nitride, silicon oxynitride, or silicon carbide. In some embodiments, liner layer 510 can be formed using spin-on-glass, fluorine-doped silicate glass (FSG), a low-k dielectric material, other suitable insulating material, and/or combinations thereof. Liner layer 510 can be formed by a blanket deposition process of the dielectric liner material followed by a chemical-mechanical polishing (CMP) and/or etch-back process. Other fabrication techniques for liner layer 510 are possible. In some embodiments, liner layer 510 has a thickness $t_1$ between about 10 nm and about 300 nm (e.g., between 10 nm and 300 nm). The thickness $t_1$ can be determined by a number of factors. For example, a liner layer 510 having greater thickness $t_1$ can provide improved protection from metal diffusion but also reduces contact conductivity due to less space available for the conductive material filling in pad structure 509.

Capping layer 512 is formed in a bottom portion of peripheral opening 508 and on liner layer 510. Capping layer 512 can prevent metal oxidation of metal fill 514 in subsequent processes. In some embodiments, capping layer 512 can be formed using an aluminum copper alloy (AlCu). In some embodiments, capping layer 512 can be formed using conductive materials such as, for example, copper, aluminum, tungsten, other suitable conductive materials, and/or combinations thereof. Capping layer 512 can be formed by a blanket deposition process of the conductive material followed by an etch-back process such that the conductive material forms at the bottom of peripheral opening 508. Other fabrication techniques for capping layer 512 are possible. In some embodiments, capping layer 512 has a thickness between about 0.2 µm and about 1.5 µm (e.g., between 0.2 µm and 1.5 µm). In some embodiments, a capping layer with greater thickness can provide improved protection from metal oxidation of metal fill 514.

Metal fill 514 is formed on capping layer 512. In some embodiments, capping layer 512 may not be used and metal fill 514 alone is formed on liner layer 510 to fill peripheral opening 508. In some embodiments, metal fill 514 can be formed using conductive materials such as, for example, copper, aluminum, aluminum copper alloy, tungsten, any other suitable conductive material, and/or combinations thereof. Metal fill 514 can be formed by a blanket deposition process of the conductive material followed by a chemical-mechanical polishing process and/or etch-back process such that the conductive material forms in peripheral opening 508. After the planarization or etch-back process, a top surface of metal fill 514 is coplanar with a top surface of semiconductor layer 504. Other fabrication techniques for metal fill 514 are possible. A ratio between thicknesses of capping layer 512 and metal fill 511 can be in a range between about 5% to about 95%.

Figure 6:
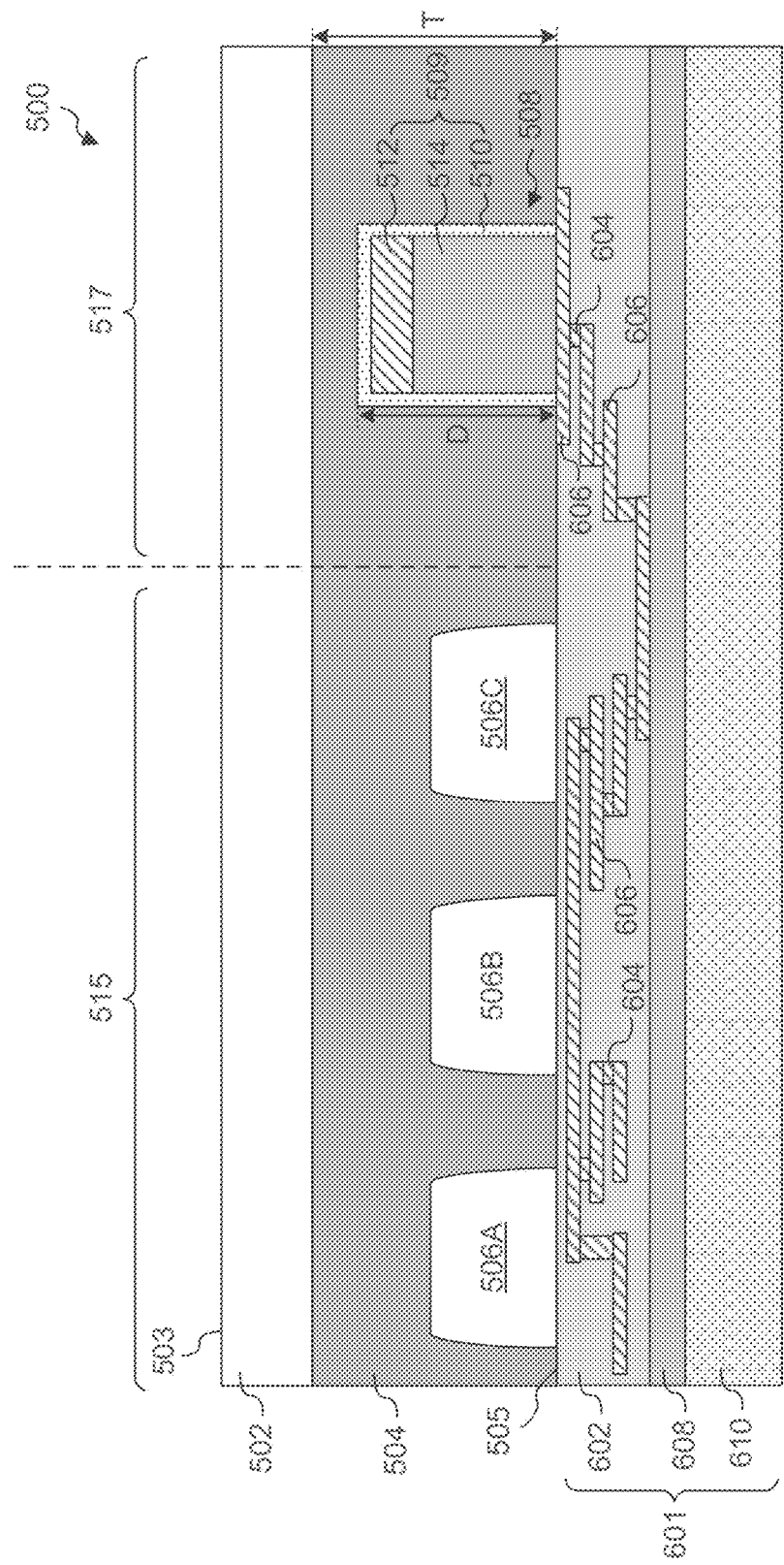

FIG. 6 is a cross-sectional view of a partially-fabricated BSI image sensor device 500 after an interconnect structure is bonded, in accordance with some embodiments of the present disclosure. The partially-fabricated BSI image sensor device in FIG. 5 is flipped over and semiconductor layer 504 is bonded to a carrier wafer 601 at front surface 505. In some embodiments, carrier wafer 601 is bonded to semiconductor layer 504 by a suitable bonding method such as, for example, fusion bonding, hybrid bonding, anodic bonding, direct bonding, any other suitable bonding process, and/or combinations thereof. Carrier wafer 601 can include an interlayer dielectric 602, conductive vias 604, conductive lines 606, a buffer layer 608, and a carrier substrate 610. Carrier wafer 601 and its components can be similar to carrier wafer 201 and its corresponding components; for example, carrier wafer 601 can also include MLI structures. In some embodiments, the structures can be different depending on device design and performance needs.

As mentioned above with reference to FIG. 5, the location of peripheral opening 508 is aligned with an interconnect structure of carrier wafer 601. The MLI structure includes a conductive line 606 aligned with and in physical contact with metal fill 514 after the bonding process. Therefore, a desired location of metal fill 514 can be determined using the location of conductive line 606 in carrier wafer 601, or vice versa. After the bonding process, capping layer 512 and metal fill 514 are electrically coupled to conductive line 606.

Figure 7:
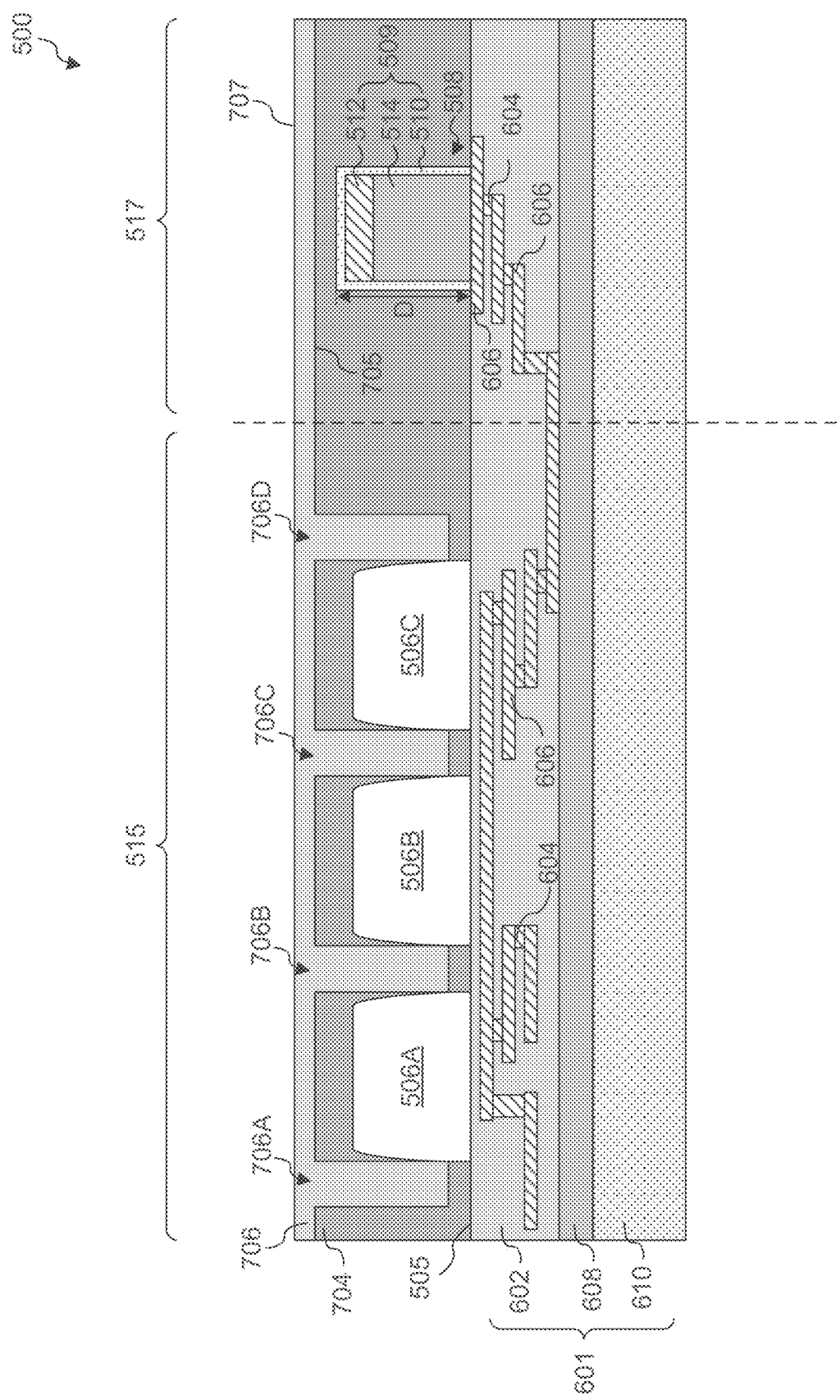

FIG. 7 is a cross-sectional view of a partially-fabricated BSI image sensor device 500 after BDTI structures have been formed in a semiconductor layer, in accordance with some embodiments of the present disclosure. Partially-fabricated image sensor device 500 includes a patterned semiconductor layer 704 and BDTI structures 706A-706D formed using a gap fill material 706. BDTI structures 706A-706D can prevent crosstalk between photo detectors (e.g., between adjacent photo detectors 506A and 506B and between adjacent photo detectors 506B and 506C).

Substrate 502 is removed, and semiconductor layer 504 can be thinned prior to forming trenches between photo detectors. Methods to remove substrate 502 and to form trenches can be similar to methods described above with reference to FIG. 3. In some embodiments, other suitable methods to remove substrate 502 and to form trenches can be used. Patterned semiconductor layer 704 is formed after semiconductor layer 504 has been thinned and patterned. Patterned semiconductor layer 704 has a top surface 705. In some embodiments, trenches are formed in semiconductor layer 704 without semiconductor layer 704 being thinned. In some embodiments, trenches can be high aspect ratio trenches such as, for example, trenches having an aspect ratio greater than 6.

Isolation material 706 is deposited over the exposed surface of patterned semiconductor layer 704 by a blanket deposition. After deposition, isolation material 706 is planarized. Isolation material 706 fills the trenches and forms BDTI structures 706A-706D. Each BDTI structure is formed between two photo detectors; for example, BDTI structure 706B is formed between photo detectors 506A and 506B and BDTI structure 706C is formed between photo detectors 506B and 506C. Isolation material 706 and BDTI structures 706A-706D can be formed using methods similar to methods of forming isolation material 306 and BDTI structures 306A-306D above in FIG. 3. In some embodiments, a liner layer (not shown) is formed between isolation material 706 and patterned semiconductor layer 704. After isolation material is deposited, a planarization process such as, for example, a chemical mechanical polishing process is performed on the deposited isolation material 706 to form a planar top surface 707.

As shown in FIG. 7, pad structure 509 is formed in patterned semiconductor layer 704 prior to the formation of BDTI structures. Peripheral opening 508 and embedded pad structure 509 are embedded in patterned semiconductor layer 704 and also covered by isolation material 706 during the trench etching and subsequent planarization processes. Therefore, pad structure 509 can be protected from the etching and planarization processes without the need of depositing a dielectric fill material such as dielectric fill 310 described above in FIG. 3. In addition, different material selectivity of the planarization process that causes across-wafer non-uniformity can be avoided because the planarization process used here planarizes one material (e.g., isolation material 706) rather than simultaneously planarizing two or more materials (e.g., isolation material 306 and dielectric fill 310) as described above with reference to FIG. 3.

Figure 8:
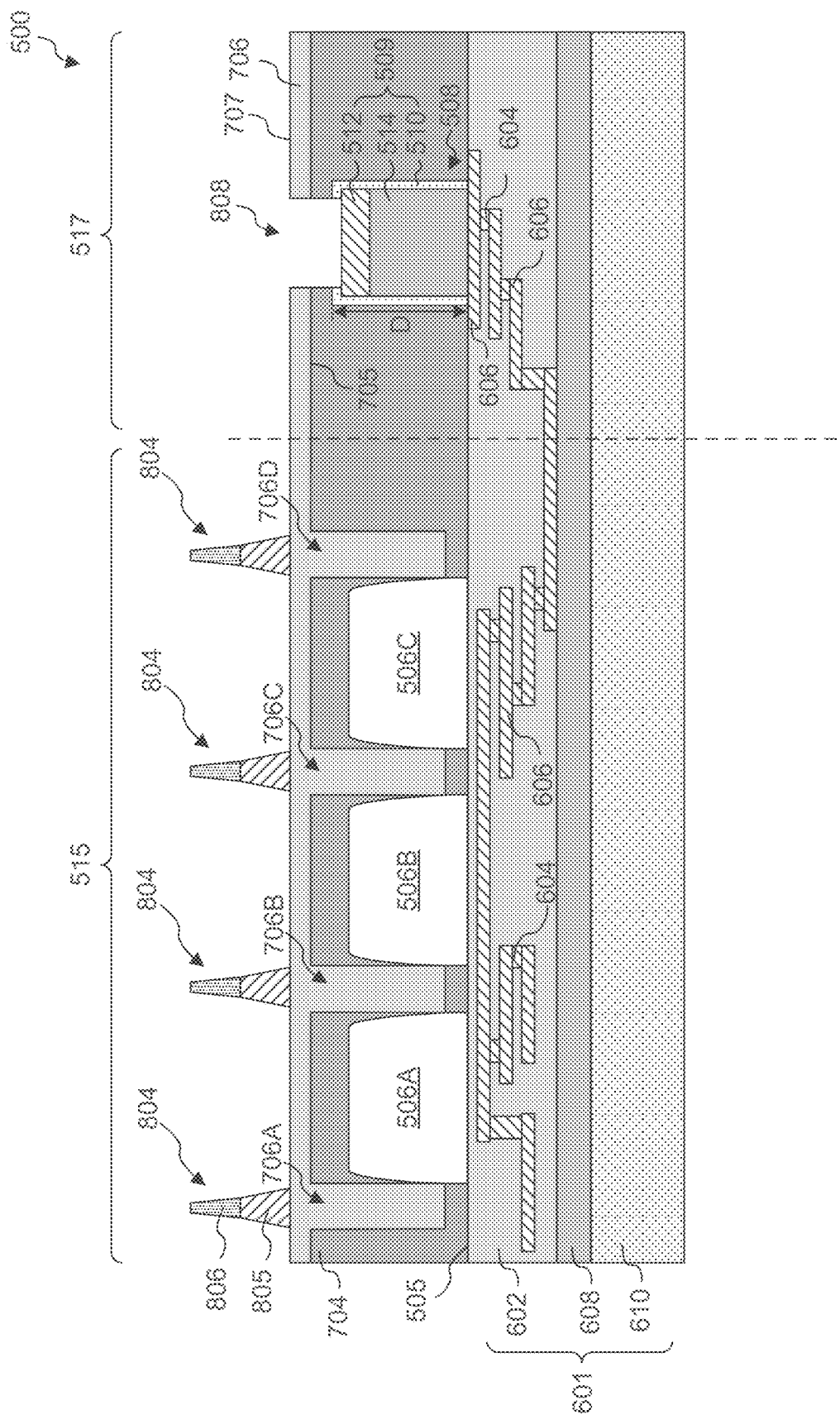

FIG. 8 is a cross-sectional view of a partially-fabricated BSI image sensor device 500 after CMG structures and pad openings are formed on a top surface of a patterned semiconductor layer, in accordance with some embodiments of the present disclosure. Across-wafer uniformity is achieved as planarized isolation material 706 provides a uniform planar top surface for the formation of CMG structures. In addition, structure defects due to concave surfaces are minimized because a "dishing effect" on the back side surface is prevented when the pad structure is embedded in patterned semiconductor layer 704 and covered by isolation material 706.

Metal grid structures, such as CMG structures 804, are formed over BDTI structures 706A-706D and on top surface 707 of isolation material 706. CMG structures 804 are formed on the planarized top surface of isolation material 706 as shown in FIG. 7, while pad structure 509 is covered by patterned semiconductor layer 704 and isolation material 706 during the CMG structure formation. CMG structures 804 can be similar to CMG 404 as described above in FIG. 4 and formed using similar methods. For example, CMG structures 804 can include a first portion 805 formed using a metal material and a second portion 806 formed using a dielectric material. CMG structures 804 are not limited to the above structure and material, and can have more than two portions and include more than two types of material.

Pad opening 808 is formed in partially fabricated BSI image sensor device 500 to expose a portion of pad structure 509. Pad opening 808 can be formed using a patterning and etching process to remove portions of isolation material 706 and portions of patterned semiconductor layer 704 such that a portion of pad structure 509 is exposed. The patterning process can include forming a photoresist layer overlying isolation material 706, exposing the resist to a pattern, performing a post-exposure bake processes, and developing the resist to form a masking element including the resist. The masking element can protect regions of isolation material 706, while the etching processes remove exposed portions of isolation material 706, underlying portions of liner layer 510, and patterned semiconductor layer 704. The exposed portions can be etched using a reactive ion etch (RIE), a wet etching process, any other suitable process, and/or combinations thereof. The etching processes are selected based on the materials to be etched. The etching processes for isolation material 706, patterned semiconductor layer 704, and liner layer 510 can be the same or different from each other, depending on the materials used. In some embodiments, the etch processes can be RIE processes using oxygen-based plasma. In some embodiments, the RIE etching process may include other etchant gases such as, for example, nitrogen, carbon tetrafluoride ($CF_4$), and/or other suitable gases. After the etch process, the masking layer is subsequently removed by any suitable process such as, for example, any suitable resist strip process, plasma ash process, hard mask removal process, and/or any other suitable processes. As shown in FIG. 8, after the etch process, a portion of capping layer 512 is exposed to provide electrical connections to external circuitry. In some embodiments, where pad structure 509 includes a single metal fill 514 without capping layer 512, a portion of the metal till 514 is exposed by pad opening 808.

Figure 9:
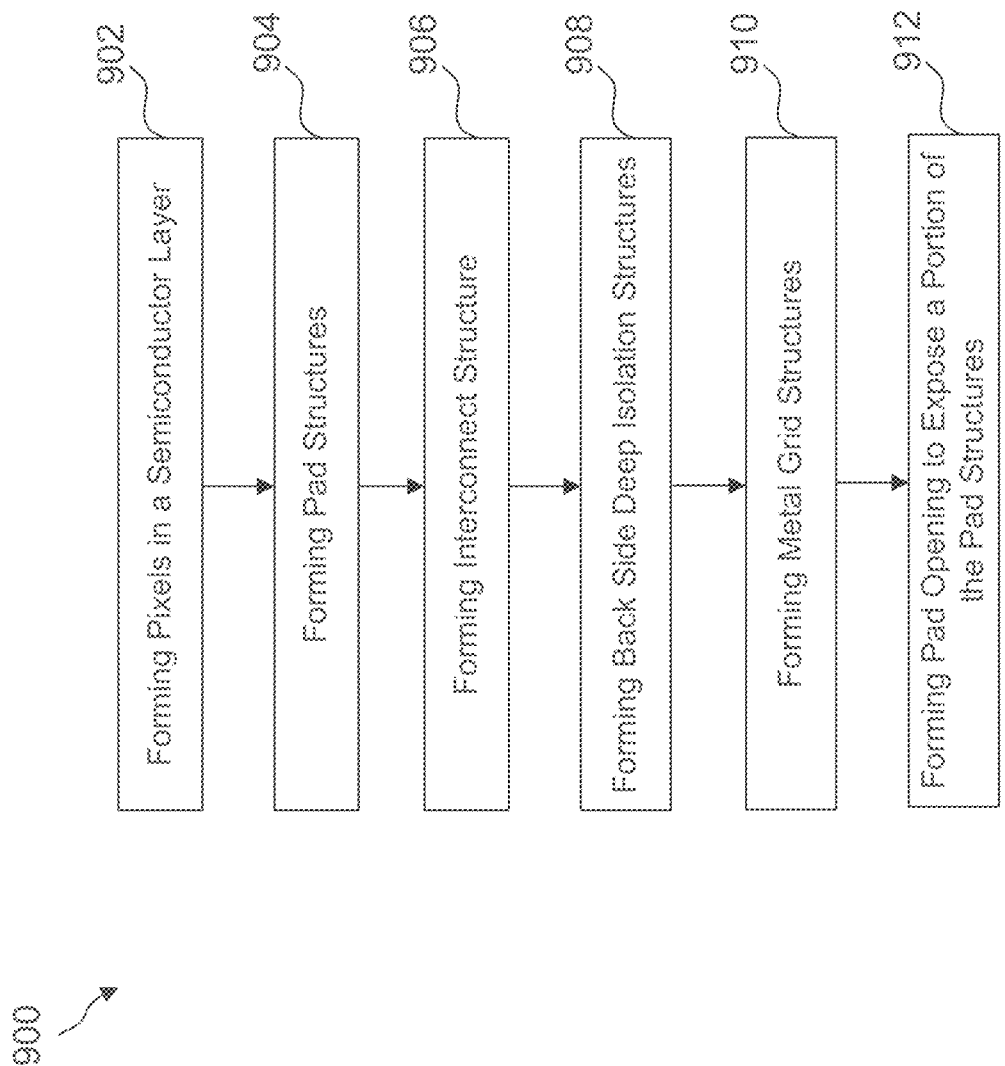
FIG. 9 is a flow diagram of an exemplary method for forming an image sensor device with pad structure formed during an FEOL process, in accordance with some embodiments.

FIG. 9 is a flow diagram of an example method 900 for forming an image sensor device with a pad structure formed during an FEOL process, in accordance with some embodiments of the present disclosure. Other operations in method 900 can be performed, and operations of method 900 can be performed in a different order and/or vary.

At operation 902, photo detectors are formed in a semiconductor layer and over a substrate, in accordance with some embodiments. The substrate can be a p-type substrate or an n-type substrate. The substrate can have an initial thickness in a range from about 100 μm to about 3000 μm. A semiconductor layer can be formed on the substrate. In some embodiments, the semiconductor layer can be an epitaxial material strained for performance enhancement. In some embodiments, the semiconductor layer has a thickness greater than 2 μm. The photo detectors can be formed in the semiconductor layer and configured to sense radiation such as incident light waves. In some embodiments, the photo detectors are capable of sensing non-visible light. The photo detectors can each include a photodiode structure. Examples of the substrate, the semiconductor layer, and the photo detectors can be respective substrate 102, semiconductor layer 104, and photo detectors 106A-106C are described above with reference to FIG. 1.

At operation 904, pad structures are formed in a semiconductor layer and over a substrate, in accordance with some embodiments. Pad structures are formed in portions of the semiconductor layer designated as pad regions. Pad regions are peripheral regions adjacent to photo detectors and used for pad structure formation. The peripheral openings are formed in the semiconductor layer and placed at locations where conductive structures of a carrier wafer are located. The carrier wafer can be subsequently bonded to the semiconductor layer through wafer bonding. The depth of the peripheral opening can be in a range of about 80% to about 95% (e.g., 80% to 95%) of the thickness of the semiconductor layer. Examples of pad structures can be pad structure 509 described in FIG. 5.

The pad structure is formed in the peripheral opening and can include a liner layer, a capping layer, and a metal fill. The liner layer is formed in the peripheral opening to protect the exposed surface of semiconductor layer during subsequent fabrication processes or to prevent electro-migration and/or metal diffusion into the semiconductor layer. In some embodiments, the liner layer has a thickness between about 10 nm and about 300 nm (e.g., between 10 nm and 300 nm). Examples of liner layer can be liner layer 510 described in FIG. 5.

A capping layer is formed in the bottom portions of the peripheral opening and on the liner layer. The capping layer can prevent metal oxidation of the metal fill material. In some embodiments, the capping layer can be formed using an aluminum copper alloy, copper, aluminum, tungsten, any other suitable conductive material, and/or combinations thereof. The capping layer can have a thickness between about 0.2 μm and about 1.5 μm (e.g., between 0.2 μm and 1.5 μm). Examples of capping layer can be capping layer 512 described in FIG. 5.

A metal fill is formed in the peripheral opening and on the capping layer. The capping layer may not be used and the metal fill can be formed on the liner layer and fill the peripheral opening. After a planarization or etch-back process, a top surface of the metal fill is coplanar with a top surface of the semiconductor layer. Examples of metal fill can be metal fill 514 described above in FIG. 5.

At operation 906, an interconnect structure is formed, in accordance with some embodiments. A carrier wafer including the interconnect structure can be bonded to the semiconductor layer. The semiconductor layer can be bonded to the carrier wafer by any suitable bonding method such as, for example, fusion bonding, hybrid bonding, any other suitable bonding method, and/or combinations thereof. The carrier wafer can include an interlayer dielectric, conductive vias, conductive lines, a buffer layer, and a carrier substrate. An example of the carrier wafer and its components can be carrier wafer 601 and its corresponding components described in FIG. 6. The interlayer dielectric can be formed on the semiconductor layer. Conductive layers and structures that provide interconnections between various features, circuitry, and input/output of the image sensor device can be embedded in the interlayer dielectric. Examples of the conductive layers and structures can be conductive vias 604 and conductive lines 606 described above with reference to FIG. 6.

At operation 908, BDTI structures are formed, in accordance with some embodiments. The substrate is removed and the semiconductor layer can be thinned prior to forming trenches that are used for the BDTI structures. Isolation material is deposited to fill the trenches and form BDTI structures. Each BDTI structure can be formed between photo detectors. After isolation material is deposited, a planarization process—such as, for example, a chemical mechanical polishing process—is performed on the deposited isolation material to form a planar top surface. Pad structures are formed in the patterned semiconductor layer prior to the formation of BDTI structures. The peripheral opening and embedded pad structure are embedded in the patterned semiconductor layer and also covered by isolation material during the trench etching and subsequent planarization processes. Therefore, the pad structure can be protected from the etching and planarization processes without the need of depositing a dielectric fill material. In addition, different material selectivity of the planarization process that causes across-wafer non-uniformity can be avoided because one material is planarized in this operation. Examples of the BDTI structures can be BDTI structures 706A-706D described above in FIG. 7.

At operation 910, metal grid structures are formed over the isolation material, in accordance with some embodiments. Metal grid structures, such as CMG structures, are formed on the isolation material. Metal grid structures can be formed on the planarized top surface of isolation material while the pad structure is covered by the semiconductor material and the isolation material. Metal grid structures can include a first portion formed using a metal material and a second portion formed using a dielectric material. Examples of metal grid structures can be CMG structures 804 described in FIG. 8.

At operation 912, a pad opening is formed to expose a portion of the pad structures, in accordance with some embodiments. Pad openings are formed to expose a portion of the pad structure such as, for example, a capping layer or a metal fill layer. The pad opening can be formed using a patterning and etching process to remove portions of the isolation material, portions the patterned semiconductor structure, and portions of the liner layer such that a portion of the pad structure is exposed. In some embodiments, a portion of the capping material is exposed to provide electrical connections to external circuitry after the etch process. In some embodiments where the pad structure includes a single metal fill material without using a capping structure, a portion of the metal fill layer is exposed by the pad opening. Examples of pad openings can be pad opening 808 described in FIG. 8.

Various embodiments in accordance with this disclosure describe forming a pad structure in an image sensor device (e.g., BSI image sensor device) during an FEOL process. Peripheral openings and pad structures are formed in an FEOL process, prior to the formation of BDTI structures and metal grid structures. The pad structure is protected by a semiconductor layer during subsequent processes, thus eliminating the need to fill the peripheral openings with a dielectric material. After the BDTI structures and metal grid structures are formed, an opening is formed on a back side of the image sensor device to expose the embedded pad structure and to form electrical connections. Formation of the pad structure during the FEOL process provides numerous benefits, such as elimination of the need of a dielectric fill process prior to planarization. Another benefit is the formation of a uniform planarized wafer surface prior to CMG formation; in turn, this leads to across-wafer uniformity.

In some embodiments, a method of forming a semiconductor image sensor device includes forming a plurality of photo detectors in a semiconductor layer. The plurality of photo detectors are configured to detect light that enters into the semiconductor layer through a first surface of the semiconductor layer. The semiconductor layer is etched to form a first opening in a second surface of the semiconductor layer. The second surface is opposite to the first surface. A pad structure is formed in the first opening and includes a metal fill. Interconnect structures are disposed on the second surface of the semiconductor layer. The method further includes etching the semiconductor layer to form a second opening in the semiconductor layer to expose at least a portion of the pad structure.

In some embodiments, a method of forming a semiconductor image sensor device includes forming a plurality of photo detectors in a semiconductor layer. The method also includes etching the semiconductor layer to form a first opening in a surface of the semiconductor layer and adjacent to at least one pixel of the plurality of photo detectors. A pad structure is formed in the opening and includes a liner layer and a metal fill. The method further includes forming a plurality of isolation structures in the semiconductor layer. Metal grid structures are formed on the plurality of isolation structures. The semiconductor layer is etched to form a second opening in the semiconductor layer to expose at least a portion of the pad structure.

In some embodiments a semiconductor image sensor device includes a semiconductor layer having a first surface and a second surface that is opposite to the first surface. The semiconductor image sensor device also includes an interconnect structure disposed over the first surface of the semiconductor layer. The semiconductor image sensor device includes a plurality of radiation-sensing regions formed in the semiconductor layer which are configured to sense radiation that enters the semiconductor layer from the second surface. The semiconductor image sensor device further includes a plurality of back side deep trench isolation (BDTI) structures formed in the semiconductor layer. A pad structure formed in the semiconductor layer has a depth less than a thickness of the semiconductor layer.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A semiconductor image sensor device, comprising:
    a semiconductor layer having a first surface and a second surface that is opposite to the first surface;
    an interconnect structure disposed on the first surface of the semiconductor layer;
    a plurality of radiation-sensing regions formed in the semiconductor layer, wherein the plurality of radiation-sensing regions are configured to sense radiation that enters the semiconductor layer from the second surface;
    a plurality of back side deep trench isolation (BDTI) structures formed in the semiconductor layer;
    a pad structure formed in the semiconductor layer, the pad structure comprising:
        a metal fill, wherein a bottom surface of the metal fill is in contact with a conductive line of the interconnect structure;
        a capping structure on the metal fill; and
        a liner layer on the capping structure, wherein the liner layer is in contact with the metal fill and a top surface and a sidewall of the capping structure; and
        an opening through the liner layer, wherein the opening exposes the top surface of the capping structure.

2. The semiconductor image sensor device of claim 1, wherein the pad structure has a depth less than a thickness of the semiconductor layer.

3. The semiconductor image sensor device of claim 1, wherein a sidewall of the metal fill is in contact with the liner layer.

4. The semiconductor image sensor device of claim 1, further comprising an isolation material formed on the second surface of the semiconductor layer.

5. The semiconductor image sensor device of claim 1, wherein the capping structure is configured to be electrically connected to external circuitry.

6. The semiconductor image sensor device of claim 1, wherein the bottom surface of the metal fill is substantially coplanar with the first surface of the semiconductor layer.

7. The semiconductor image sensor device of claim 1, wherein the conductive line is in contact with the liner layer.

8. A semiconductor image sensor device, comprising:
    a plurality of photo detectors in a semiconductor layer, wherein the plurality of photo detectors are configured to sense radiation that enters the semiconductor layer from a first surface;
    a pad structure in the semiconductor layer, the pad structure comprising:
        a metal fill;
        a capping layer on the metal fill; and
        a liner layer between the metal fill and the semiconductor layer, wherein the liner layer is in contact with the metal fill and a top surface and a sidewall of the capping layer;
    an interconnect structure attached to a second surface of the semiconductor layer that is opposite to the first surface, wherein at least one conductive line of the interconnect structure is in contact with the metal fill; and
    an opening through the liner layer, wherein the opening exposes the top surface of the capping layer.

9. The semiconductor image sensor device of claim 8, further comprising an isolation material that includes a plurality of deep trench isolation structures in the semiconductor layer.

10. The semiconductor image sensor device of claim 9, wherein at least one deep trench isolation structure is between adjacent photo detectors of the plurality of photo detectors.

11. The semiconductor image sensor device of claim 8, wherein a depth of the pad structure as measured from the second surface of the semiconductor layer is between about 80% and about 95% of a thickness of the semiconductor layer.

12. The semiconductor image sensor device of claim 8, wherein the capping layer is configured to be electrically connected to external circuitry.

13. The semiconductor image sensor device of claim 8, wherein the liner layer is in contact with a sidewall of the metal fill.

14. The semiconductor image sensor device of claim 8, wherein the at least one conductive line is in contact with the liner layer.

15. A semiconductor image sensor device, comprising:
    a plurality of photo detectors in a semiconductor layer, wherein the plurality of photo detectors are configured to sense radiation that enters the semiconductor layer from a top surface of the semiconductor layer;
    a pad structure in the semiconductor layer, the pad structure comprising:
        a metal fill;
        a capping layer on the metal fill; and
        a liner layer, wherein the liner layer is in contact with the metal fill and a top surface and a sidewall of the capping layer;
    an isolation material on the top surface of the semiconductor layer and over the pad structure;
    an interconnect structure bonded to a bottom surface of the semiconductor layer that is opposite to the top surface of the semiconductor layer, wherein at least one conductive line of the interconnect structure is in contact with a bottom surface of the metal fill; and an opening at the top surface of the semiconductor layer, where the opening exposes the capping layer through the isolation material and the liner layer.

16. The semiconductor image sensor device of claim 15, wherein the liner layer is in contact with a sidewall of the metal fill.

17. The semiconductor image sensor device of claim 15, wherein the at least one conductive line is in contact with the liner layer.

18. The semiconductor image sensor device of claim 15, wherein the isolation material comprises at least one deep trench isolation structure between adjacent photo detectors of the plurality of photo detectors.

19. The semiconductor image sensor device of claim 15, wherein a depth of the pad structure is measured from a bottom surface of the semiconductor layer that is opposite to the top surface of the semiconductor layer, and wherein the depth is between about 80% and about 95% of a thickness of the semiconductor layer.

20. The semiconductor image sensor device of claim 15, wherein the capping layer is configured to be electrically connected to external circuitry.

* * * * *